US006559729B2

United States Patent
Goma et al.

(10) Patent No.: US 6,559,729 B2
(45) Date of Patent: May 6, 2003

(54) OSCILLATOR, METHOD FOR PRODUCING OSCILLATOR, AND COMMUNICATION APPARATUS INCORPORATING SAME

(75) Inventors: Shinji Goma, Ishikawa-ken (JP); Masao Uno, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/817,482

(22) Filed: Mar. 26, 2001

(65) Prior Publication Data

US 2001/0033203 A1 Oct. 25, 2001

(30) Foreign Application Priority Data

Mar. 28, 2000 (JP) ........................................ 2000-089252

(51) Int. Cl.[7] .................................................. H03B 5/18
(52) U.S. Cl. ..................................... 331/99; 331/117 D
(58) Field of Search ........................ 331/107 SL, 107 R, 331/108 C, 99, 117 D, 117 R, 177 V; 324/652, 655, 76.11–76.77; 361/782, 783

(56) References Cited

U.S. PATENT DOCUMENTS 4,535,307 A * 8/1985 Tsukii ..................... 324/158.1
5,805,026 A * 9/1998 Kuroda et al. .......... 331/107 SL

* cited by examiner

Primary Examiner—Robert Pascal
Assistant Examiner—Joseph Chang
(74) Attorney, Agent, or Firm—Keating & Bennett, LLP

(57) ABSTRACT

A miniaturized oscillator that is manufactured with greatly reduced production time and cost includes transmission lines defining resonance circuits provided on a circuit assembly board. In this state, the impedance of each transmission line is measured. Then, according to the transmission line impedance, chip components having impedances necessary to obtain a predetermined frequency are selected and mounted on the circuit substrate. With this arrangement and method of formation, the resulting oscillator oscillates at the desired oscillation frequency and it is not necessary to trim the transmission lines in order to achieve this result. Since the oscillator does not require time to make frequency adjustments and does require use of a trimming apparatus, no deterioration in the electric characteristics due to laser trimming occurs. In addition, it is unnecessary to provide an electrode land for making frequency adjustments. As a result, the entire oscillator is miniaturized.

7 Claims, 3 Drawing Sheets

OSCILLATOR, METHOD FOR PRODUCING OSCILLATOR, AND COMMUNICATION APPARATUS INCORPORATING SAME

BACKGROUND OF THE INVENTION

1. Field of the Invention

The present invention relates to oscillators, methods for producing oscillators, and communication apparatuses incorporating oscillators.

2. Description of the Related Art

Conventionally, an oscillator used for a high frequency circuit, such as a microwave band frequency circuit, includes a resonance circuit, which is defined by transmission lines such as a microstrip line and chip components such as capacitance elements disposed on a circuit substrate, and an amplifier amplifying a resonance signal output from the resonance circuit.

In each conventional oscillator formed by packaging oscillation circuits composed of components mounted on printed circuit substrates, first, electrode patterns are provided in oscillation-circuit forming sections on a printed circuit assembly board used to produce a plurality of oscillators. Then, chip components are mounted on the electrode patterns, and connections are made by reflow soldering. After that, the printed circuit assembly board is divided into oscillation-circuit forming sections to adjust the oscillation frequency of the various sections. Finally, a metal cover is attached to the assembly board to complete the product.

In the conventional oscillators including the resonance circuits defined by the transmission lines such as microstrip lines provided on the printed circuit assembly board, however, variations in impedance between the transmission lines occur, particularly, variations in inductance between the transmission lines. In addition, there are variations in impedance between the chip components, such as chip capacitors defining the resonance circuits together with the transmission lines. Thus, the oscillation frequencies of the oscillators are higher or lower than a design value. As a result, trimming each of the transmission lines disposed on the circuit assembly board is required to make adjustments to obtain a desired oscillation frequency. Such a process causes the following problems.

Since frequency adjustment time is necessary, production time is greatly increased, thereby substantially increasing cost. In addition, laser trimming requires an expensive laser trimming apparatus. Furthermore, since the time-consuming laser trimming carbonizes the transmission lines, this results in a lower Q of the resonators, thereby deteriorating the characteristics of oscillators, such as C/N ratio characteristics.

Furthermore, since electrode lands for trimming are necessary, the entire oscillator cannot be miniaturized.

SUMMARY OF THE INVENTION

To overcome the above-described problems with the prior art, preferred embodiments of the present invention provide an oscillator which greatly reduces production time and cost and which achieves miniaturization without deteriorating the electrical characteristics. In addition, preferred embodiments of the present invention provide a method for producing the oscillator and a communication apparatus incorporating the oscillator.

According to a first preferred embodiment of the present invention, a method for producing an oscillator includes a resonance circuit including a transmission line provided on a circuit substrate and chip components mounted on the circuit substrate and an amplifying circuit amplifying a resonance signal of the resonance circuit. The oscillator producing method includes the steps of measuring the impedance of the transmission line of the resonance circuit when the transmission line is disposed on the circuit substrate, determining the impedances of chip components included in the resonance circuit, selecting chip components having impedances required to obtain a desired oscillation frequency from the chip components according to the transmission line impedance to mount on the circuit substrate, and mounting the chip components on the circuit substrate.

As described above, according to the impedance of the transmission line provided on the circuit substrate, chip components having impedances required to obtain the desired oscillation frequency are selected and mounted on the circuit substrate. With this arrangement, without trimming the transmission line, an oscillator oscillating at the predetermined oscillation frequency is obtained. As a result, since frequency-adjustment time is not required and it is unnecessary to use a trimming apparatus, no deterioration in the electric characteristics due to laser trimming occurs. In addition, since it is unnecessary to provide an electrode land for making frequency adjustments, the entire oscillator is miniaturized.

Furthermore, in the oscillator-producing method described above, the circuit substrate may be a circuit assembly board, on which a plurality of oscillator-forming sections is provided, and in this state, measuring the impedance of each transmission line and mounting the chip components are performed. In this manner, on the circuit assembly board, chip components such as chip capacitors are individually selected and mounted according to the impedances of the transmission lines disposed in the sections where the oscillation circuits are provided. Thus, since it is unnecessary to measure the impedances of the transmission lines as individual components, the transmission line impedances are easily measured.

According to a second preferred embodiment of the present invention, an oscillator includes a resonance circuit including a transmission line provided on a circuit substrate and chip components mounted on the circuit substrate, an amplifying circuit connected to the resonance circuit to amplify a resonance signal output from the resonance circuit, and an electrode land provided on the circuit substrate and electrically connected to the transmission line and abutting the probe of a measurement apparatus for measuring the impedance of the transmission line. Using of the circuit substrate having the oscillator, the transmission line impedance is easily measured. Since the position of the electrode land is fixed on the circuit substrate, the measurement of the transmission line impedance can be automated.

According to a third preferred embodiment of the present invention, a communication apparatus incorporating the oscillator is provided having the above-described novel structure. For example, the communication apparatus is produced by using the oscillator as a local oscillation circuit. With this arrangement, a compact and low-priced communication apparatus is obtained.

Other features, characteristics, elements and advantages of the present invention will become more apparent from the following detailed description of preferred embodiments thereof with reference to the attached drawings.

DETAILED DESCRIPTION OF PREFERRED EMBODIMENTS

A voltage-controlled oscillator according to a first preferred embodiment will be described with reference to FIG. 1 and FIGS. 2A to 2C.

Figure 1:
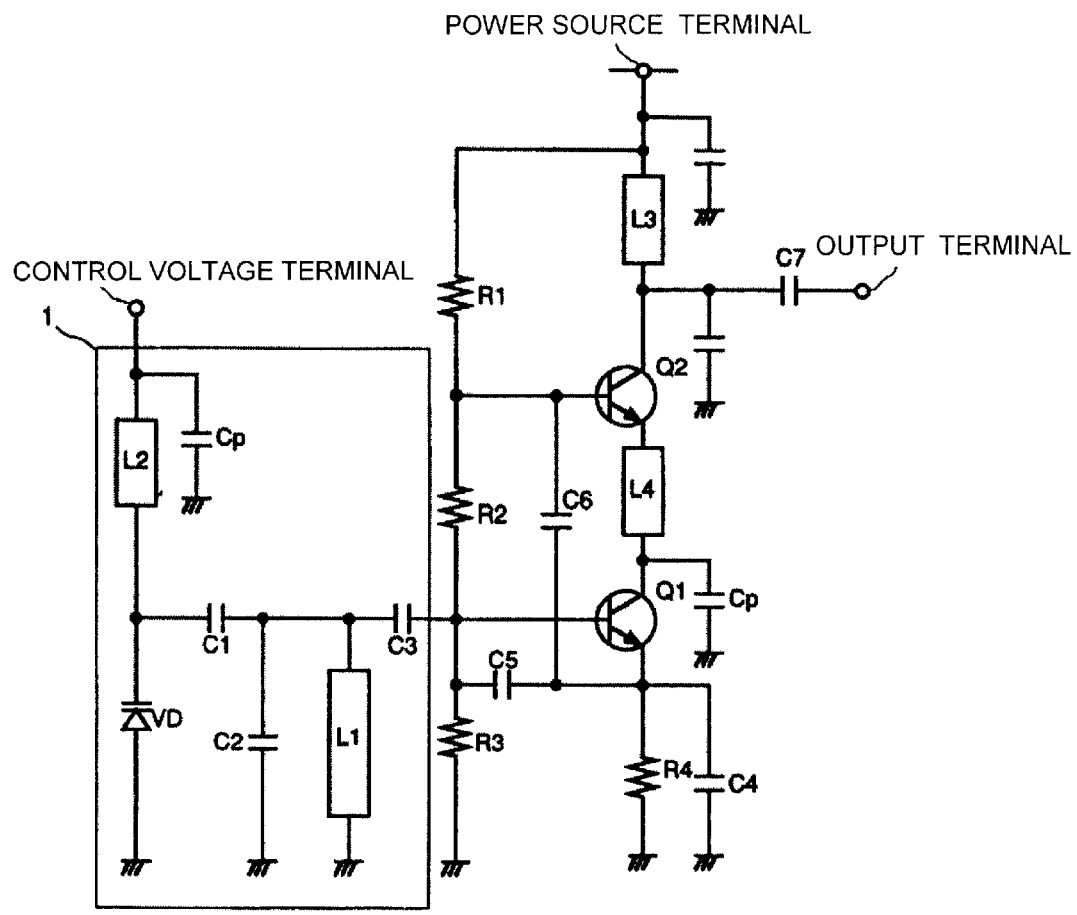
FIG. 1 shows a circuit diagram of a voltage-controlled oscillator according to a preferred embodiment of the present invention.

In FIG. 1, the reference numeral 1 denotes a resonance circuit. The resonance circuit 1 includes microstrip lines L1 and L2, chip capacitors C1, C2, and C3, a varactor diode VD, and a bypass capacitor Cp.

The reference character Q1 denotes an oscillation transistor. The collector of the oscillation transistor Q1 is grounded at a high frequency through the bypass capacitor Cp. A resistor R4 and a capacitor C4 are disposed between the emitter of the oscillation transistor Q1 and a ground. In addition, a capacitor C5 is connected between the emitter of the oscillation transistor Q1 and the base thereof. Since the collector of the oscillation transistor Q1 is grounded at high frequency via the bypass capacitor Cp, eventually, the resonance circuit 1 is equivalently connected between the collector of the oscillation transistor Q1 and the base thereof. With this arrangement, a modified Colpitts-type oscillation circuit is provided.

A transistor Q2 is a buffer transistor. Resistors R1, R2, and R3 define a base bias circuit of the transistors Q1 and Q2. A power-supply voltage is applied to the collector of the transistor Q2 via a microstrip line L3. In addition, a microstrip line L4 is connected between the emitter of the transistor Q2 and the collector of the transistor Q1. A signal from the emitter of the transistor Q1 is input to the base of the transistor Q2 via a capacitor C6. Then, an oscillation signal is output from the collector of the transistor Q2 via a capacitor C7.

Since the capacitance of the varactor diode VD changes with a control voltage applied from a control voltage terminal, the resonance frequency of the resonance circuit 1, that is, the oscillation frequency of the oscillator is controlled by the control voltage. The varying range of the oscillation frequency with respect to the control voltage is determined by the capacitance-change characteristics with respect to the applied-voltage changes in the varactor diode VD and the values of L1, C1, C2, and C3. As will be described below, before the capacitors C1, C2, and C3 and the varactor diode VD are mounted on the circuit substrate, the impedance of the microstrip line L1, particularly, the inductance thereof is measured. According to the measured impedance value, the chip capacitors C1, C2, and C3 and the varactor diode VD having capacitances necessary to resonate at a desired resonance frequency are selectively mounted.

Figure 2A:
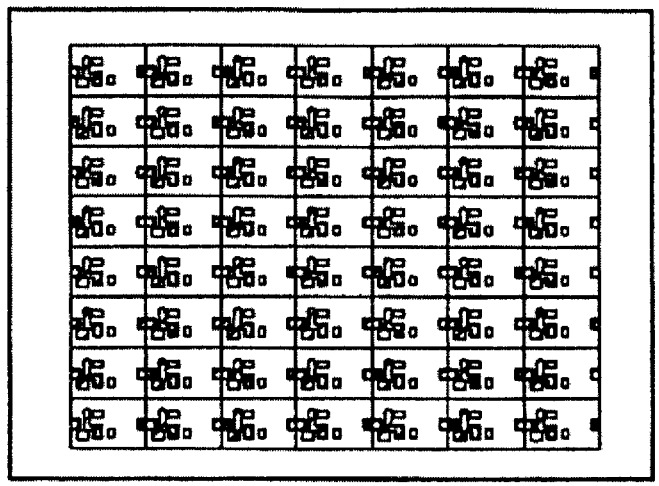
FIGS. 2A to 2C show a plan view for illustrating a circuit assembly board including the voltage-controlled oscillators provided thereon and enlarged views for illustrating an oscillation-circuit section.
Figure 2B:
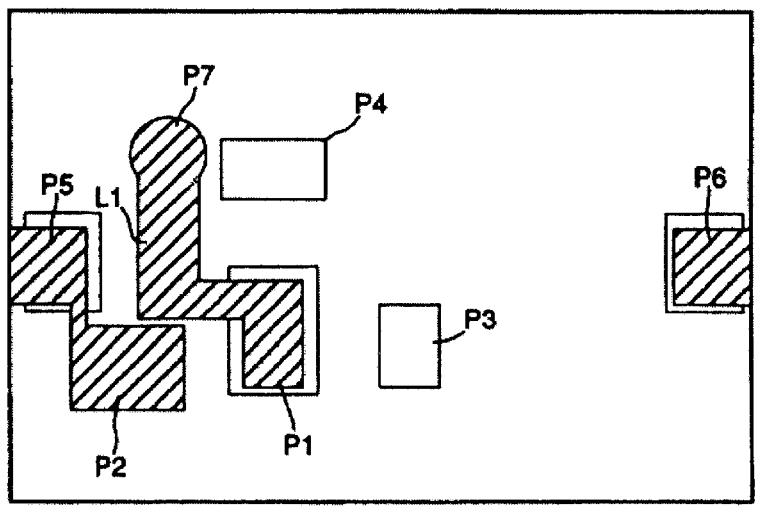
Figure 2C:
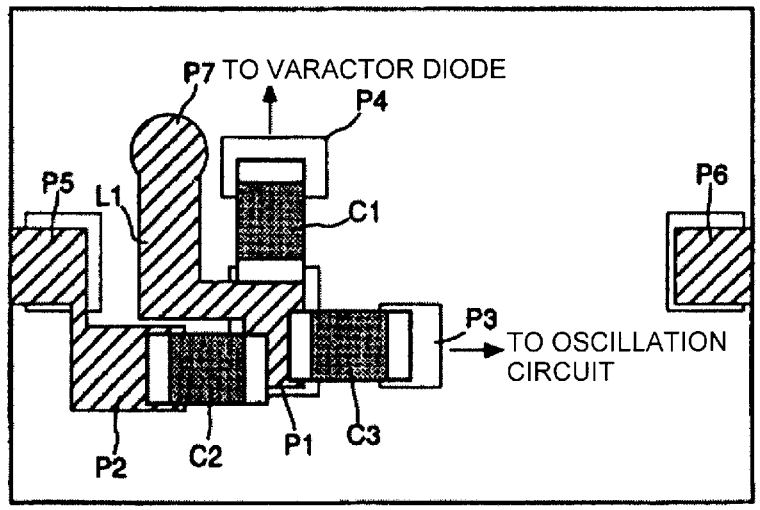

Each of FIGS. 2A, 2B, and 2C shows a plan view of the circuit substrate including the voltage-controlled oscillator provided thereon. FIG. 2A shows a top view of a printed circuit assembly board before mounting chip components. Each section shown in FIG. 2A is an oscillation-circuit forming section, which is configured as an oscillator.

FIG. 2B shows an enlarged view of one of the oscillation-circuit sections. In this figure, only a resonance circuit is shown. The reference characters P1 to P4 denote electrode lands for mounting the chip capacitors C1, C2, and C3, and the reference character P7 denotes a through-hole electrically connected to a ground electrode. The microstrip line L1 is formed between the through-hole P7 and the electrode land P1. In addition, the reference numerals P5 and P6 denote ground electrodes. The electrode land P3 is connected to the oscillation circuit, and the electrode land P4 is connected to the varactor diode VD. As shown in FIG. 2B, before mounting chip components, the probe of a measurement apparatus abuts with each of the electrode lands P1 and P6 to measure the impedance of the microstrip line L1.

In FIG. 2C, according to the impedance of the line L1, the chip capacitors C1, C2, and C3 having capacitances required to obtain the predetermined oscillation frequency are selected and mounted on the electrode lands.

In general, the resonance frequency of an LC resonance circuit is obtained by an expression $1/\{2\pi\sqrt{(LC)}\}$. An expression for obtaining the oscillation frequency of a voltage-controlled oscillator is actually complicated since the values of a plurality of components affect the oscillation frequency. However, basically, the oscillation frequency can be approximately calculated by the above expression. Thus, the oscillation frequency is controlled by controlling the inductance component and capacitance component of the resonance circuit.

Next, there will be shown the detailed example of a voltage-controlled oscillator for the 900 MHz band.

First, in the printed circuit assembly board shown in FIG. 2A, the impedance of a microstrip line of each section is measured with a network analyzer or an impedance analyzer. The impedance values are stored as data, in addition to the control number of the printed circuit assembly board and numbers corresponding to the positions of the sections provided on the printed circuit assembly board. The impedance values of microstrip lines tend to be approximate values between adjacent sections in the characteristics of a method for producing a printed circuit substrate. Thus, instead of individually obtaining the impedance value of each section, a representative value of each block obtained by grouping the plurality of sections is obtained and stored as data.

In addition to the impedance measurement of the microstrip lines, the capacitance of each chip capacitor to be mounted on the circuit substrate is measured in advance to be divided and selected by setting certain capacitance specifications.

To set the oscillation frequency of the voltage-controlled oscillator within a desired target frequency range, the impedances of the microstrip lines and the capacitances of the chip capacitors are appropriately combined. These combinations are determined based on experimental data and simulation results obtained during a designing stage. Based on this data, chip capacitors having capacitances selected according to the impedances of the microstrip lines of the sections are mounted. With this arrangement, since the oscillation frequency of the voltage-controlled oscillator falls within the target range, no subsequent frequency adjustments are required.

For example, capacitors C1 having approximate capacitances of 3.25 pF to 3.30 pF, capacitors C2 having approximate capacitances of 2.15 to 2.20 pF, and capacitors C3 having approximate capacitances of 2.65 to 2.70 pF are selected and mounted on 20 pieces of circuit substrates having microstrip lines having measured inductance values of about 3.8 nH to 3.9 nH. In this situation, the oscillation frequency was within a range of 914 MHz to 926 MHz. In other words, when the measured inductance values of the microstrip lines fall within the range of 3.8 nH to 3.9 nH, the oscillation frequency can be set in the range of about 914 MHz to 926 MHz by selectively mounting chip capacitors classified by capacitance specifications including the approximate capacitances of 3.25 pF to 3.30 pF for the capacitors C1, the approximate capacitances of 2.15 pF to 2.20 pF for the capacitors C2, and the approximate capacitances 2.65 pF to 2.70 pF for the capacitors C3.

When the capacitance specifications of the capacitors and the range of the inductance of the microstrip line are further divided into smaller segments, the desired oscillation frequency can be set within a narrower frequency range.

As mentioned above, it is unnecessary to make frequency adjustments. Thus, more specifically, the following advantages could be gained.

| COMPARISON ITEM | CONVENTIONAL ART | PRESENT INVENTION | RESULT |
|---|---|---|---|
| PRODUCTION TIME PER PRODUCT | 57 SECONDS | 45 SECONDS | REDUCTION BY 12 SECONDS |
| INDIRECT COST PER PRODUCT | 32 YEN | 24 YEN | REDUCTION BY 8 YEN |

The reduction by 8 yen will be specified as follows:

A laser trimming apparatus: 30 million yen

A set of capacitor capacitance selection apparatuses: 22 million yen

Balance: 8 million yen

The set of capacitor capacitance selection apparatuses includes an impedance measurement apparatus for measuring the impedances of strip lines.

In this case, assuming that a total of 1 million products are produced, a reduction by 8 yen is achieved (8 million yen/1 million pieces).

Figure 3:
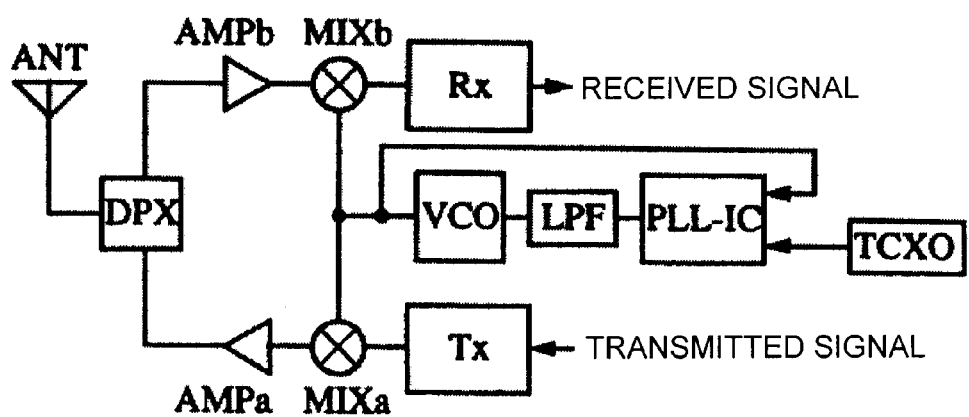
FIG. 3 is a block diagram of a communication apparatus incorporating the voltage-controlled oscillator.

Next, FIG. 3 shows a block diagram of the structural example of a communication apparatus according to a second preferred embodiment of the invention. In FIG. 3, the reference character VCO denotes the above voltage-controlled oscillator. The reference character PLL-IC denotes a PLL control circuit to which a signal output from the VCO is input. The PLL-IC performs a phase comparison between the input signal and the oscillation signal of a temperature compensated crystal oscillator TCXO and outputs a control signal to obtain a desired frequency and a desired phase. The VCO receives a control voltage with its control terminal via a low pass filter LPF and oscillates at a frequency according to the control voltage. The oscillation output signal is sent as local oscillation signals to mixing circuits MIXa and MIXb. The mixing circuit MIXa mixes an intermediate frequency signal output from a transmission circuit Tx and the local oscillation signal to convert into a transmission frequency signal. This signal is amplified by an amplifying circuit AMPa and output from an antenna ANT via a duplexer DPX. A signal sent from the antenna ANT is amplified by an amplifying circuit AMPb via the duplexer DPX. The mixing circuit MIXb mixes the signal output from the amplifying circuit AMPb and the local oscillation signal to convert into an intermediate frequency signal. A reception circuit Rx performs the signal processing of the intermediate frequency signal to obtain the received signal.

Since the voltage-controlled oscillator VCO used in the communication apparatus has a high C/N ratio, the apparatus has outstanding characteristics in essential performance items, such as adjacent-channel selection characteristics, mutual-modulation distortion characteristics, and unnecessary-radiation characteristics. In addition, the communication apparatus can be miniaturized and produced at low cost.

As described above, in preferred embodiments of the present invention, without trimming transmission lines, an oscillator oscillating at a predetermined frequency can be produced. Thus, since frequency adjustments can be easily made and no trimming apparatus is required, significant cost reduction can be achieved. Moreover, since there is no deterioration in the electric characteristics due to laser trimming, a high C/N ratio can be obtained. In addition, since it is unnecessary to in advance dispose electrode lands for making frequency adjustments, the entire structure of the oscillator can be miniaturized.

Since a transmission line-impedance measurement is not required for an individual component, impedance measurement is very efficiently performed.

Since the impedance of each of the transmission lines disposed on the printed circuit substrate to define the oscillator is easily measured and the position of each electrode land on the circuit substrate is fixed, the transmission line-impedance measurement can be automated.

Furthermore, for example, when the oscillator having the above structure is disposed as a local oscillation circuit, the communication apparatus is compact and produced at low cost.

While the invention has been particularly shown and described with reference to preferred embodiments thereof, it will be understood by those skilled in the art that the foregoing and other changes in form and details can be made without departing from the spirit and scope of the invention.

What is claimed is:

1. A method for producing an oscillator including a resonance circuit having a transmission line provided on a circuit substrate and chip components mounted on the circuit substrate and an amplifying circuit amplifying a resonance signal of the resonance circuit, the method comprising the steps of:

measuring the impedance of the transmission line provided on the circuit substrate of the resonance circuit;

determining the impedances of chip components to be included in the resonance circuit;

selecting chip components that have impedances required to obtain a desired oscillation frequency based on the transmission line impedance for mounting the selected chip components on the circuit substrate; and mounting the selected chip components on the circuit substrate.

2. A method for producing an oscillator according to claim 1, wherein the circuit substrate is a circuit assembly board on which a plurality of oscillator-forming sections is provided, and the steps of measuring the impedance of each transmission line and mounting the chip components are performed in this state.

3. A method for producing an oscillator according to claim 1, further comprising the step of providing electrode lands for mounting the chip components on the circuit substrate.

4. A method for producing an oscillator according to claim 1, further comprising the steps of forming a ground electrode of the oscillator, and forming a through-hole to electrically connect to said ground electrode.

5. A method for producing an oscillator according to claim 1, further comprising the step of measuring the capacitance of the chip components to set capacitance settings for the oscillator.

6. A method for producing an oscillator according to claim 1, wherein the measuring of the impedance is performed with the use of a network analyzer.

7. A method for producing an oscillator according to claim 1, the measuring of the impedance is performed with the use of an impedance analyzer.

* * * * *